US005790037A

United States Patent [19]

Walblay

[11] Patent Number: 5,790,037
[45] Date of Patent: Aug. 4, 1998

[54] POLARITY INDICATOR FOR A BATTERY

[76] Inventor: Allen D. Walblay, 5815 E. Grand River, Howell, Mich. 48843

[21] Appl. No.: 766,965

[22] Filed: Dec. 16, 1996

[51] Int. Cl.⁶ .......................... G08B 21/00; G01R 19/14
[52] U.S. Cl. .............. 340/636; 340/815.47; 340/815.48; 340/815.73; 324/426; 324/133; 320/48; 362/184; 362/200
[58] Field of Search ...................... 324/133, 426, 324/435, 556; 340/636, 815.47, 815.48, 815.49, 815.5, 815.55, 815.73, 815.76; 362/157, 184, 186, 200, 205, 85; 320/25, 26, 48

[56] References Cited

U.S. PATENT DOCUMENTS

| 3,936,121 | 2/1976 | Leinberger | 340/636 |
| 4,272,142 | 6/1981 | Zapf | 324/133 |
| 4,488,147 | 12/1984 | Signorile | 340/636 |
| 4,913,981 | 4/1990 | Hynes et al. | 429/1 |
| 4,924,176 | 5/1990 | Tremblay | 324/133 |
| 5,111,130 | 5/1992 | Bates | 320/25 |

*Primary Examiner*—Vinh P. Nguyen
*Assistant Examiner*—Diep Do
*Attorney, Agent, or Firm*—Mary M. Moyne; Ian C. McLeod

[57] ABSTRACT

A polarity indicator (10) for identifying the polarity of the terminals (104 and 106) of a vehicle battery (102). The indicator includes a housing (12) which is mounted by a fastener (14) on to the vehicle battery. The top wall (12A) of the housing has positive and negative indicia (16 and 18) for assisting the user in identifying the terminals of the vehicle battery. An electrical circuit is mounted within the housing of the indicator. The circuit includes a pair of light bulbs (30), a battery (32) and a time delay opening switch (34). The indicator is activated by pressing the button (34A) of the switch to complete the circuit which causes the light bulbs to illuminate the positive and negative indicia of the indicator.

18 Claims, 4 Drawing Sheets

POLARITY INDICATOR FOR A BATTERY

BACKGROUND OF THE INVENTION

(1) Field of the Invention

The present invention relates to a polarity indicator for identifying the polarity of the battery terminals of a vehicle battery. In particular, the present invention relates to a polarity indicator which provides illuminated indicia to allow the user to determine the polarity of the battery terminals of a vehicle battery for correct connection of jumper cables.

When attempting to use jumper cables to start a vehicle having a dead battery, it is essential that the jumper cables are correctly connected between the vehicles. The jumper cables must be connected such that each cable extends between the terminals of the batteries having the same polarity. Incorrect connection of the jumper cables can have very serious consequences including damaging the batteries and/or the electrical system of one or both vehicles and possibly, even the electrocution of the user. In general, most vehicle batteries have indicia indicating the polarity of the terminals. However, these indicia are often difficult to read especially in poor lighting conditions.

(2) Description of Related Art

The related art has shown various devices for determining the polarity of the terminals of a vehicle battery to allow for the proper connection of jumper cables. Illustrative are U.S. Pat. Nos. 5,111,130 to Bates; 4,924,176 to Tremblay; 4,913, 981 to Hynes et al; 4,488,147 to Signorile; 4,272,142 to Zapf and 3,936,121 to Leinberger.

In particular, Signorile, Zapf and Leinberger describe jumper cables which provide a warning signal when they are incorrectly connected between two batteries.

Bates and Tremblay describe polarity indicators which are mounted onto the batteries and to which the jumper cable is attached prior to connection to the battery terminal in order to determine whether connection of that cable to the adjacent terminal would be correct. One end of the jumper cable must be connected to one of the batteries in order for the indicator to work.

Hynes shows a kit for indicating the polarities of the terminals of a battery. The kit includes a pair of markers having either a plus (+) or a minus (−) sign. The markers are mounted on the battery adjacent the correct terminal using double-sided adhesive tape. The markers have a round shape and are made of a hard colored plastic. The indicia on the markers can be raised. In addition, the markers can be of different colors to indicate the different polarities. The markers do not have a source of illumination.

There remains a need for a polarity indicator which allows the user to determine the polarity of a battery terminal even in poor lighting conditions, which is easily mounted onto the battery and which does not require prior connection of the jumper cables to one of the batteries.

OBJECTS

Therefore, it is an object of the present invention to provide a polarity indicator for a vehicle battery which is self-contained. Further, it is an object of the present invention to provide a polarity indicator for a vehicle battery which enables the user to determine the polarity of the battery terminal in low light conditions. Still further, it is an object of the present invention to provide a polarity indicator for a vehicle battery which is easy to mount on the battery. Further, still it is an object of the present invention to provide a polarity indicator for a vehicle battery which is inexpensive and easy to manufacture. These and other objects will become increasingly apparent from the following detailed description and from the drawings.

DETAILED DESCRIPTION OF THE PREFERRED EMBODIMENTS

The present invention relates to an apparatus for indicating the polarity of terminals on a vehicle battery which comprises: a housing having a bottom wall provided with attachment means for mounting on the battery and a top wall having indicia and a sidewall therebetween forming an enclosure; an illumination means mounted in the enclosure of the housing so as to illuminate the indicia on the top wall of the housing when provided with current; a current power source connected to the illumination means; and an activation means for selectively, manually activating the illumination means from the current power source to illuminate the indicia to indicate the polarity of the battery.

The apparatus has a (+) and a (−) along with the words "RED" and "BLACK". The words and signs are on opposite sides of the time delay opening switch and are illuminated by a pair of light bulbs positioned beneath each of the indicia.

Figure 1:
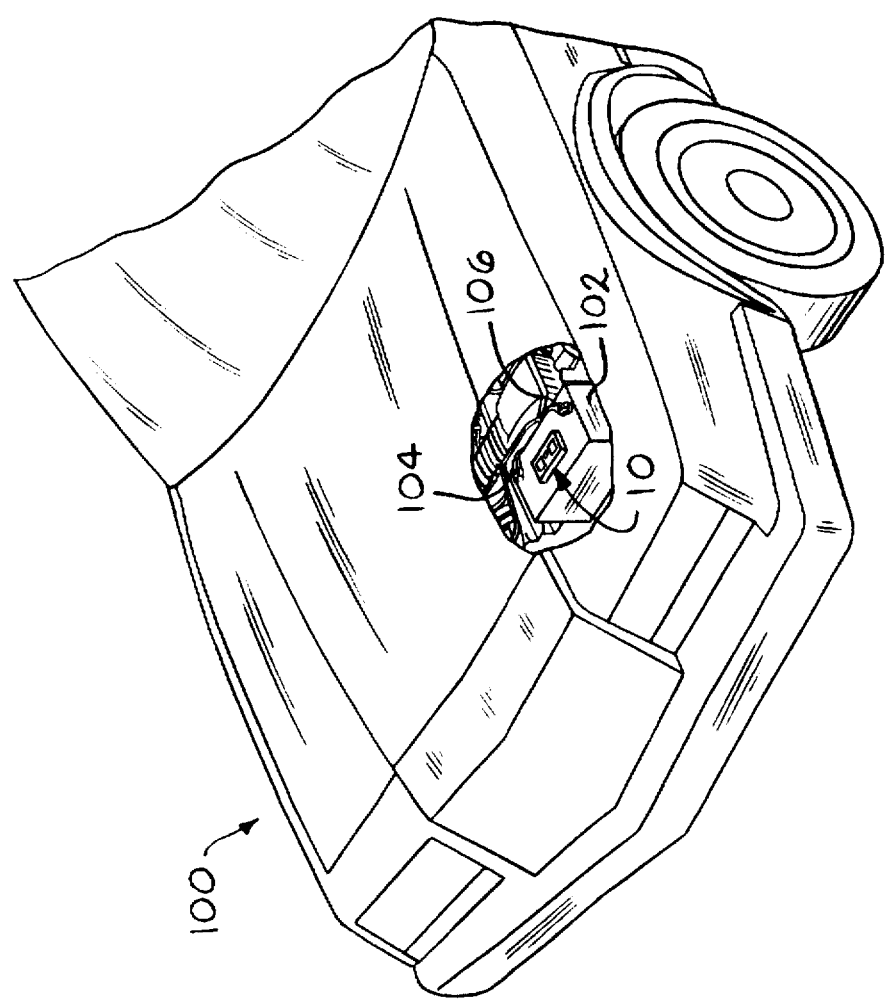
FIG. 1 is a partial, front perspective view of a vehicle 100 showing the polarity indicator 10 mounted on the battery 102 of the vehicle 100.
Figure 4:
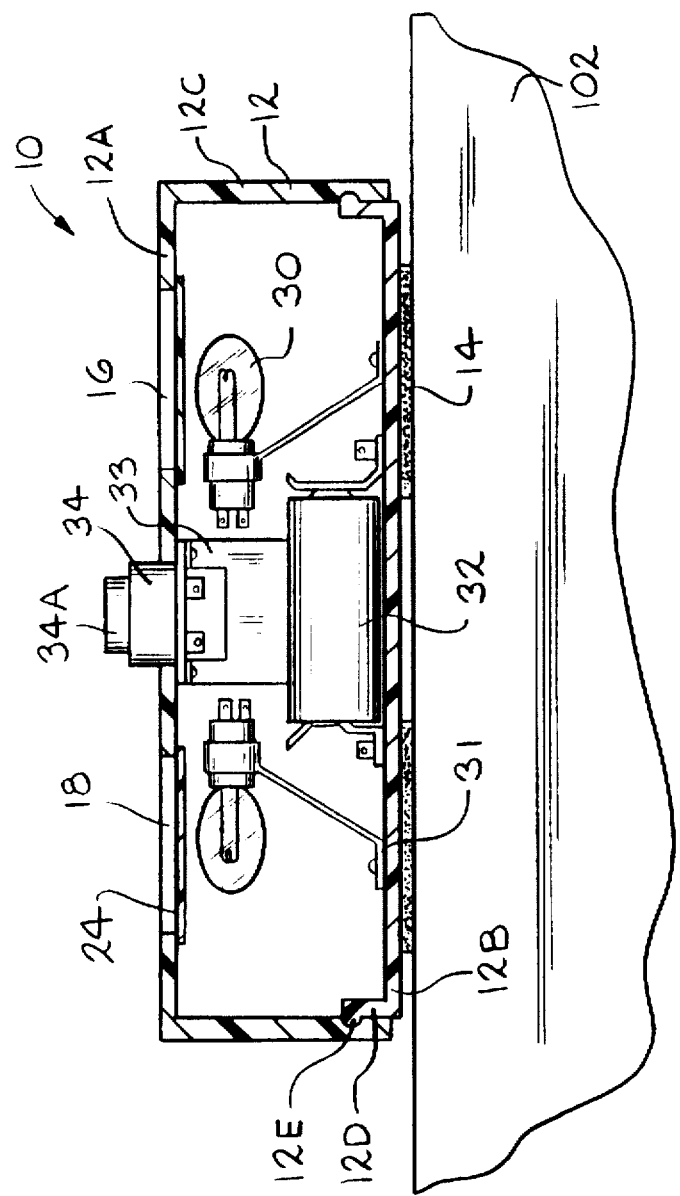
FIG. 4 is a cross-sectional side view of the polarity indicator 10 of FIG. 1 showing the light bulbs 30, the battery 32 and the switch 34.

FIGS. 1 and 4 show the polarity indicator 10 of the present invention. The polarity indicator 10 includes a housing 12 having a top wall 12A, four side walls 12B and a bottom wall 12C forming an enclosure. In the preferred embodiment, the top wall 12A and the four side walls 12B of the housing 12 are formed as an integral piece and are snapped onto the bottom wall 12C of the housing 12 (FIG. 4). The bottom wall 12C of the housing 12 is preferably provided with an inner lip 12D around the circumference having an outward extending rib 12E around the lip 12D which allows the top wall 12A and side walls 12B to be snap fit over the bottom wall 12C. Preferably, the top wall 12A is close fit over the bottom wall 12C such as to prevent dirt and other debris from entering the enclosure of the housing 12 and to form a sealed enclosure. The ability to remove the top wall 12A with the side walls 12B from the bottom wall 12C, allows the battery 32 or the light bulbs 30 (to be described in detail hereinafter) of the indicator 10 to be replaced which increases the useable life of the indicator 10. Alternately, the housing 12 is a sealed unit having a battery door (not shown) in the bottom wall 12C to allow for replacement of the battery 32. In another alternate embodiment, the housing 12 is a single unit which is disposable once the indicator 10 becomes inoperative. The bottom wall 12C is preferably provided with a fastener 14 for mounting the indicator 10 on the vehicle battery 102 (FIGS. 1 and 4). In the preferred embodiment, the fastener 14 is double-sided tape. Alternately, the fastener 14 is a hook and loop fastener with half of the fastener 14 on the top 12A of the battery 32 and the opposite half on the bottom wall 12C of the indicator 10. However any type of fastener 14 well known in the art may be used. The indicator 10 is of a size such as to not interfere with the operation of the vehicle battery 102. The polarity indicator 10 is preferably rectangular in shape with a size of 3.0×5.0 inches (7.6×12.7 cm) and a height of 0.75 inches (1.91 cm). The housing 12 of the indicator 10 is preferably constructed of a durable and inexpensive plastic.

Figure 2:
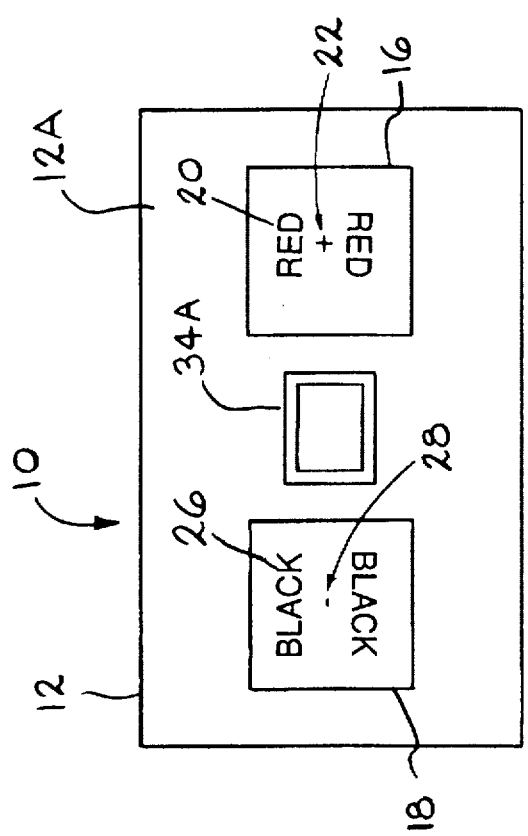
FIG. 2 is a top view of the polarity indicator 10 showing the switch button 34A and the positive and the negative indicia 16 and 18.

The top wall 12A of the housing 12 is provided with positive and negative indicia 16 and 18 adjacent opposite side walls 12B of the indicator 10 (FIG. 2). The positive indicia 16 is preferably provided with the words 20 "RED" with a (+) sign 22 spaced between the two words 20. The words 20 and the sign 22 are preferably in the form of openings in the top wall 12A of the indicator 10 which allows light from the light bulbs 30 to shine through the openings thus, enabling the words 20 and the sign 22 to be read in poor lighting conditions. The openings are preferably provided with transparent inserts 24 which allow the light to shine through but which prevent dirt and other debris from entering the housing 12 of the indicator 10. The inserts 24 can be colored to coincide with the words 20 "RED" and also to allow the user to distinguish between the positive and negative indicias 16 and 18 even at a distance. Preferably, the words 20 are located such as to be directed oppositely from each other such that a user may read one of the words 20 from either side. This also allows for more versatility in mounting of the indicator 10. The negative indicia 18 is preferably similar to the positive indicia 16 except that the words 26 "BLACK" are positioned oppositely on either side of a (−) sign 28. The choice of the words 20 and 26 "RED" and "BLACK" reflects the usual color coding for jumper cables (not shown). Standard jumper cables usually have a red cable and a black cable with the red cable designated to be attached to the positive terminals 104 of the batteries 32 and the black cable to be attached to the negative terminals 106 of the batteries 32. The words 20 and 26 and color inserts 24 can be changed as necessary depending upon the use of the indicator 10. The indicia 16 and 18 are preferably square and of a size 1.32×1.32 inches (3.35×3.35 cm). The words 20 and 26 and signs 22 and 28 are preferably of a size as to be easily read by the user even in poor lighting.

Figure 3:
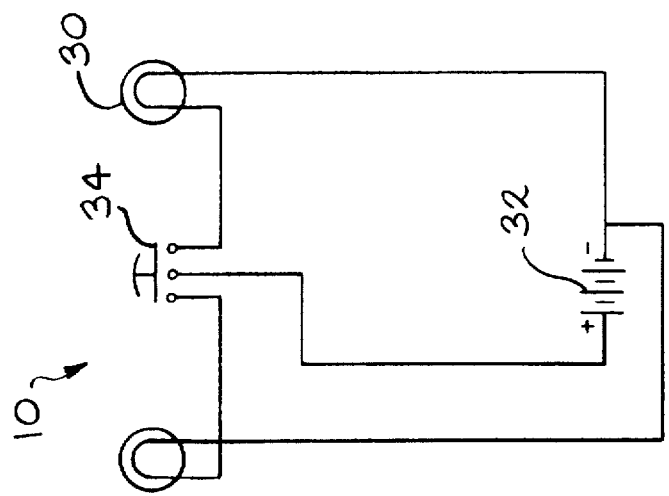
FIG. 3 is a circuit diagram of the polarity indicator 10 showing the light bulbs 30, the time delay switch 34 and the battery 32.
Figure 5:
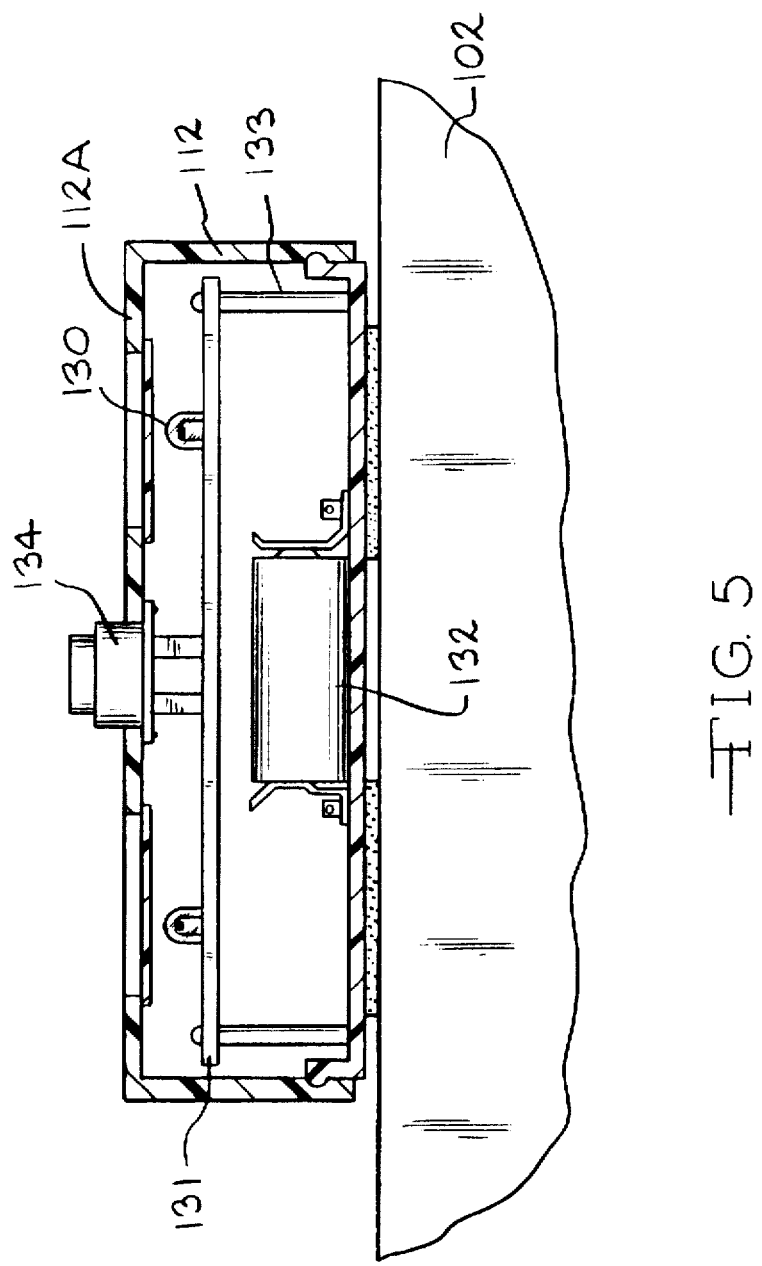
FIG. 5 is an alternate embodiment of the polarity indicator 110 showing the circuit board 131 with the LEDs 130 and the switch 134 mounted above the batteries 132.

The electrical circuit for the indicator 10 includes an illumination source, a switch 34 and a power source (FIG. 3). The illumination source are of any type which requires relatively little power, which will fit within the housing 12 of the indicator 10 and which illuminates the indicia 16 and 18 such as to enable the user to identify the polarity of the terminals 104 and 106 of the vehicle battery 102. In the preferred embodiment, the illumination source is a pair of light bulbs 30 which are positioned within the housing 12 such that one of the bulbs 30 is adjacent each of the indicia 16 and 18. The bulbs 30 are preferably 1.2 Amps and may also be different colors in order for the user to distinguish between the two indicia 16 and 18. In the alternate embodiment, the illumination source is a pair of clear LEDs 130 which provide high intensity light (FIG. 5). The LEDs 130 are preferably rated at 20 mA with 2000 mcd light output. Preferably, each of the bulbs 30 is secured to the bottom wall 12C of the housing 12 by clips 31 (FIG. 4). The clips 31 keep the bulbs 30 from moving excessively such as to prevent damage to the bulbs 30 or disconnection of the bulbs 30 from the power source during travel of the vehicle 100. The bulbs 30 may also be mounted to the top wall 12A of the housing 12 by brackets (not shown) adjacent each of the indicia 16 and 18. The bulbs 30 are connected to the power source by wires (not shown) (FIG. 3). The power source is preferably a nickel cadmium battery 32 which is mounted on the bottom wall 12C of the housing 12. The battery 32 is preferably a standard 1.5 v battery 32. The power source is of any type which is necessarily small and self contained to fit within the housing 12 such as for instance a watch battery. The indicator 10 is activated by an activation switch 34 which connects the light bulbs 30 to the battery 32. The switch 34 is preferably mounted by a bracket 33 adjacent the bottom wall 12C of the housing 12 such that the button 34A of the switch 34 extends upward through an opening in the top wall 12A of the housing 12 (FIG. 4). The opening is preferably located between the two indicia 16 and 18 such that the switch button 34A is centrally located and easy to reach. The switch 34 is preferably a momentary push button switch 34 which requires the user to remain holding the switch 34 in the depressed position in order to keep the light bulbs 30 illuminated. The button 34A of the switch 34 is preferably of such a size as to allow for easy activation of the indicator 10. Preferably, the switch button 34A is red in color such as to enable the user to easily locate the switch 34.

In the alternate embodiment, the LEDs 130 and switch 134 are mounted on a circuit board 131 within the housing 112 of the indicator 110 (FIG. 5). The circuit board 131 is spaced above the battery 132 on support pillars 133 which position the board 132 directly below the top wall 112A of the housing 112. The switch 134 is mounted on the board 131 and does not necessarily require additional support. The circuit board 131 allows for easier assembly of the indicator 110.

IN USE

The polarity indicator 10 is preferably mounted on the top of the vehicle battery 102 spaced between the terminals 104 and 106 of the vehicle battery 102 (FIG. 1). Alternately, the indicator 10 is mounted on any side of the vehicle battery 102 as long as the indicator 10 is easily viewed and reached by the user. The indicator 10 must be mounted on the vehicle battery 100 such that the positive and negative indicia 16 and 18 are adjacent the positive and negative terminals 104 and 106 respectively, of the vehicle battery 102 and are easily viewed by the user without movement of the vehicle battery 102 or any other part of the vehicle 100 (except for opening the hood of the vehicle 100). Correct mounting of the indicator 10 is essential for correct use of the indicator 10.

Once mounted, the indicator 10 is available for use. To use, the user pushes down on the button 34A of the activation switch 34 which activates the light bulbs 30 of the indicator 10. Once the switch 34 has been closed, the bulbs 30 illuminate the indicia 16 and 18 which enables the user to determine which terminal 104 or 106 of the battery 102 is positive and which is negative. The "RED" and "BLACK" words 20 and 26 of the indicia 16 and 18 also helps the user determine which cable of the jumper cables should be attached to which terminal 104 or 106. Preferably, both the source and the receiving vehicle battery 102 are provided with a polarity indicator 10 such that the user can easily determine how to correctly hook up the jumper cables using the polarity of the terminals 104 or 106 or using the color words 20 and 26 or color inserts 24 of the indicia 16 and 18 to match the color of the cables without necessarily knowing the polarity of the terminals 104 or 106.

In the preferred embodiment, the indicator 10 is activated prior to connection of the cables to the terminals 104 and 106. Preferably, the user must hold the switch 34 in the depressed position in order to keep the indicator 10 illuminated. By requiring that the user keep one hand on the indicator 10, the user is less likely to accidentally touch the two leads of the jumper cables together thus, preventing sparking. The indicator 10 preferably provides enough illumination such as to enable the user to use the indicator 10 to correctly connect the jumper cables even in poorly lit conditions such as at night.

It is intended that the foregoing description be only illustrative of the present invention and that the present invention be limited only by the hereinafter appended claims.

I claim:

1. An apparatus for indicating the polarity of terminals on a vehicle battery which comprises:

(a) a housing forming an enclosure and having a bottom wall provided with attachment means for mounting on the battery and a top wall having indicia;

(b) an illumination means mounted in the enclosure of the housing so as to illuminate the indicia of the top wall of the housing when provided with current;

(c) a current power source connected to the illumination means; and (d) an activation means for selectively, manually activating the illumination means from the current power source to illuminate the indicia to indicate the polarity of the battery.

2. The apparatus of claim 1 wherein the indicia are a (+) and a (−).

3. The apparatus of claim 2 wherein the indicia includes words "RED" adjacent the (+) and "BLACK" adjacent the (−).

4. The apparatus of claim 3 wherein the indicia are openings in the top wall of the housing.

5. The apparatus of claim 4 wherein the openings are provided with a transparent insert.

6. The apparatus of claim 3 wherein there are two "RED" words and two "BLACK" words on either side of the (+) and (−), respectively.

7. The apparatus of claim 1 wherein the illumination means is a light bulb.

8. The apparatus of claim 2 wherein the illumination means is a pair of light bulbs.

9. The apparatus of claim 8 wherein each of the light bulbs is positioned below either the (+) or the (−).

10. The apparatus of claim 1 wherein the illumination means is a pair of LEDs.

11. The apparatus of claim 10 wherein the LED are rated at 20 mA with 2000 mcd light output.

12. The apparatus of claim 1 wherein the power supply is a battery rated at 1.5 V.

13. The apparatus of claim 1 wherein the activation means is a switch.

14. The apparatus of claim 13 wherein the switch is a momentary push button switch which must be held in the depressed position in order to keep the illumination means illuminated.

15. The apparatus of claim 13 wherein the switch is mounted in an opening in the top wall of the housing.

16. The apparatus of claim 1 wherein the housing is sealed to prevent moisture and other elements from entering the enclosure of the housing.

17. The apparatus of claim 1 wherein the attachment means is double sided tape.

18. The apparatus of claim 1 wherein the illumination means and the activation means are mounted on a circuit board.

* * * * *